US012676494B2

(12) United States Patent
Choi

(10) Patent No.: US 12,676,494 B2
(45) Date of Patent: Jul. 7, 2026

(54) POWER SUPPLY MANAGEMENT APPARATUS AND OPERATING METHOD THEREOF

(71) Applicant: LG ENERGY SOLUTION, LTD., Seoul (KR)

(72) Inventor: Ho Jin Choi, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 457 days.

(21) Appl. No.: 18/030,419

(22) PCT Filed: Feb. 7, 2022

(86) PCT No.: PCT/KR2022/001835
§ 371 (c)(1),
(2) Date: Apr. 5, 2023

(87) PCT Pub. No.: WO2022/173175
PCT Pub. Date: Aug. 18, 2022

(65) Prior Publication Data
US 2023/0378785 A1     Nov. 23, 2023

(30) Foreign Application Priority Data
Feb. 9, 2021     (KR) ........................ 10-2021-0018651

(51) Int. Cl.
*H02J 7/80* (2026.01)
*G01R 31/396* (2019.01)
*H01M 10/42* (2006.01)
(52) U.S. Cl.
CPC .............. *H02J 7/80* (2026.01); *G01R 31/396* (2019.01); *H01M 10/425* (2013.01); *H01M 2010/4271* (2013.01)

(58) Field of Classification Search
CPC ...... H02J 7/0047; H02J 7/0031; H02J 7/0014; H02J 7/0048; H02J 7/005; H02J 7/0063;
(Continued)

(56) References Cited

U.S. PATENT DOCUMENTS

2008/0077823 A1    3/2008  Tanimura
2013/0229186 A1    9/2013  Shiraishi et al.
(Continued)

FOREIGN PATENT DOCUMENTS

CN      107240944 A     10/2017
CN      109378884 A      2/2019
(Continued)

OTHER PUBLICATIONS

Safety Management of Automotive Rechargeable Energy Storage Systems: The Application of Functional Safety Principles to Generic Rechargeable Energy Storage Systems, NHTSA, 2018 (Year: 2018).*
(Continued)

*Primary Examiner* — Daniel R Miller
(74) *Attorney, Agent, or Firm* — Birch, Stewart, Kolasch & Birch, LLP

(57)     ABSTRACT

A power supply management apparatus according to an embodiment disclosed herein includes a determining unit determining a level of a fault when the fault occurs, a first control unit setting a control point in time for cutting off power supply to a load according to the level of the fault and generating a first control command according to the control point in time, a second control unit generating a second control command corresponding to a power supply maintaining time when the fault occurs, and a third control unit generating a third control command for controlling the power supply to the load, based on the first control command and the second control command.

20 Claims, 8 Drawing Sheets

(58) Field of Classification Search
CPC . H02J 7/00712; G01R 31/396; G01R 31/382;
G01R 35/005; G01R 31/36; H01M
10/425; H01M 2010/4271; B60L 3/0046;
B60L 3/0084; B60L 3/0092; B60L 3/04
See application file for complete search history.

(56) References Cited

U.S. PATENT DOCUMENTS

| | | | |
|---|---|---|---|
| 2015/0188338 | A1 | 7/2015 | Moon et al. |
| 2016/0245874 | A1 | 8/2016 | Kang et al. |
| 2017/0214258 | A1 | 7/2017 | Namou et al. |
| 2017/0334308 | A1 | 11/2017 | Moon et al. |
| 2019/0288520 | A1 | 9/2019 | Abdel-Monem et al. |
| 2020/0020992 | A1 | 1/2020 | Hofer et al. |
| 2020/0174046 | A1 | 6/2020 | Yu et al. |
| 2021/0276556 | A1* | 9/2021 | Hansen ................... B60L 58/27 |
| 2022/0118856 | A1* | 4/2022 | Barajas Cortes ....... B60L 15/08 |

FOREIGN PATENT DOCUMENTS

| | | |
|---|---|---|
| DE | 10 2012 209 144 A1 | 12/2013 |
| EP | 3 595 076 A1 | 1/2020 |
| EP | 3 771 066 A1 | 1/2021 |
| JP | 2010-110033 A | 5/2010 |
| JP | 4736983 B2 | 7/2011 |
| JP | 2013-240165 A | 11/2013 |
| JP | 2014-17901 A | 1/2014 |
| JP | 2020-48350 A | 3/2020 |
| JP | 2020-137247 A | 8/2020 |
| JP | 6760009 B2 | 9/2020 |
| KR | 10-2006-0047106 A | 5/2006 |
| KR | 10-0899582 B1 | 5/2009 |
| KR | 10-2015-0076843 A | 7/2015 |
| KR | 10-2015-0097428 A | 8/2015 |
| KR | 10-1551077 B1 | 9/2015 |
| KR | 10-2017-0078414 A | 7/2017 |
| KR | 10-2019-0074670 A | 6/2019 |
| KR | 10-2020-0082312 A | 7/2020 |
| KR | 10-2020-0107813 A | 9/2020 |
| KR | 10-2020-0134976 A | 12/2020 |
| KR | 10-2192893 B1 | 12/2020 |

OTHER PUBLICATIONS

International Search Report for PCT/KR2022/001835 (PCT/ISA/210) mailed on May 16, 2022.
Supplementary European Search Report for European Application No. 22752935.1, dated Apr. 23, 2024.
Chinese Office Action and Search Report for Chinese Application No. 202280006820.4, dated Aug. 23, 2025, with partial English translation.

* cited by examiner

210

| DETERMINING UNIT 211 | FIRST CONTROL UNIT 212 | SECOND CONTROL UNIT 213 | THIRD CONTROL UNIT 214 |

POWER SUPPLY MANAGEMENT APPARATUS AND OPERATING METHOD THEREOF

CROSS-REFERENCE TO RELATED APPLICATION

This application claims priority to and the benefit of Korean Patent Application No. 10-2021-0018651 filed in the Korean Intellectual Property Office on Feb. 9, 2021, the entire contents of which are incorporated herein by reference.

TECHNICAL FIELD

Embodiments disclosed herein relate to a power supply management apparatus and an operating method thereof.

BACKGROUND ART

When a fault occurs in a battery management system (BMS), it is sometimes necessary to guarantee power supply to an electric device up to a certain point in time depending on a level of the occurring fault. However, when an unexpected error occurs in a fault monitoring component or a control component of the BMS, a switch for maintaining or cutting off the power supply is opened earlier than an expected point in time, failing to guarantee the power supply to the electric device up to the certain point in time.

As a result, when an error occurs in the fault monitoring component or the control component, the power supply to the electric device may be cut off early, causing an operation error in the electric device.

DISCLOSURE

Technical Problem

Embodiments disclosed herein aim to provide a power supply management apparatus capable of maintaining power supply up to a certain point in time according to a level of a fault when the fault occurs in a BMS, and an operating method of the power supply management apparatus.

Technical problems of the embodiments disclosed herein are not limited to the above-described technical problems, and other unmentioned technical problems would be clearly understood by one of ordinary skill in the art from the following description.

Technical Solution

A power supply management apparatus according to an embodiment disclosed herein includes a determining unit configured to determine a level of a fault when the fault occurs, a first control unit configured to set a control point in time for cutting off power supply to a load according to the level of the fault and generate a first control command according to the control point in time, a second control unit configured to generate a second control command corresponding to a power supply maintaining time when the fault occurs, and a third control unit configured to generate a third control command for controlling the power supply to the load, based on the first control command and the second control command.

According to an embodiment, the first control command may have a first value before the control point in time and have a second value from the control point in time.

According to an embodiment, the second control command may have the first value during the power supply maintaining time and have the second value after the power supply maintaining time.

According to an embodiment, the third control unit may be further configured to generate the third control command for maintaining the power supply to the load when at least any one of the first control command and the second control command has the first value.

According to an embodiment, the third control unit may include an OR logic gate or an AND logic gate.

According to an embodiment, the second control unit may be further configured to generate the second control command by using a function inhibition manager (FIM).

An operating method of a power supply management apparatus according to an embodiment disclosed herein includes determining a level of a fault when the fault occurs, setting a control point in time for cutting off power supply to a load according to the level of the fault, generating a first control command according to the control point in time, generating a second control command corresponding to a power supply maintaining time when the fault occurs, and generating a third control command for controlling the power supply to the load, based on the first control command and the second control command.

According to an embodiment, the first control command may have a first value before the control point in time and have a second value from the control point in time.

According to an embodiment, the second control command may have the first value during the power supply maintaining time and have the second value after the power supply maintaining time.

According to an embodiment, the generating of the third control command for controlling the power supply to the load, based on the first control command and the second control command is performed when at least any one of the first control command and the second control command has the first value.

According to an embodiment, the generating of the third control command for controlling the power supply to the load, based on the first control command and the second control command includes using an OR logic gate or an AND logic gate.

According to an embodiment, the generating of the second control command corresponding to the power supply maintaining time when the fault occurs is performed using a function inhibition manager (FIM).

Advantageous Effects

With a power supply management apparatus and an operating method thereof according to an embodiment disclosed herein, power supply may be maintained up to a certain point in time according to a level of a fault when the fault occurs in a BMS.

MODE FOR INVENTION

Figure 1:
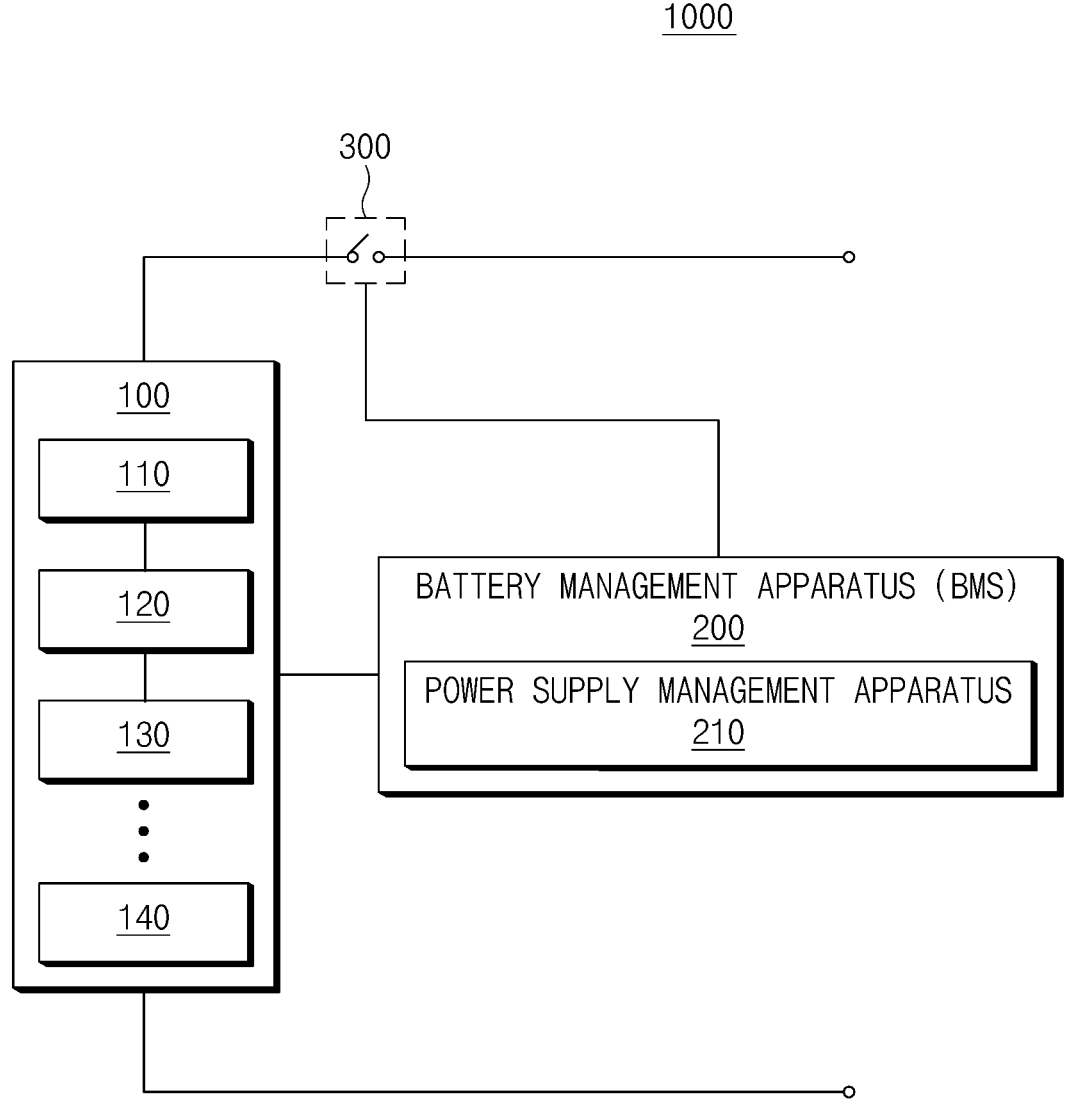
FIG. 1 illustrates a battery pack according to an embodiment disclosed herein.

Hereinafter, some embodiments disclosed in this document will be described in detail with reference to the exemplary drawings. In adding reference numerals to components of each drawing, it should be noted that the same components are given the same reference numerals even though they are indicated in different drawings. In addition, in describing the embodiments disclosed in this document, when it is determined that a detailed description of a related known configuration or function interferes with the understanding of an embodiment disclosed in this document, the detailed description thereof will be omitted.

To describe a component of an embodiment disclosed herein, terms such as first, second, A, B, (a), (b), etc., may be used. These terms are used merely for distinguishing one component from another component and do not limit the component to the essence, sequence, order, etc., of the component. The terms used herein, including technical and scientific terms, have the same meanings as terms that are generally understood by those skilled in the art, as long as the terms are not differently defined. Generally, the terms defined in a generally used dictionary should be interpreted as having the same meanings as the contextual meanings of the relevant technology and should not be interpreted as having ideal or exaggerated meanings unless they are clearly defined in the present document.

FIG. 1 illustrates a battery pack according to an embodiment disclosed herein.

Referring to FIG. 1, a battery pack 1000 according to an embodiment disclosed herein may include a battery module 100, a battery management apparatus 200, and a relay 300.

The battery module 100 may include a plurality of battery cells 110, 120, 130, and 140. Although the plurality of battery cells are illustrated as four in FIG. 1, the present invention is not limited thereto, and the battery module 100 may include n battery cells (n is a natural number greater than or equal to 2).

The battery module 100 may supply power to a target device. To this end, the battery module 100 may be electrically connected to the target device. Herein, the target device may include an electrical, electronic, or mechanical device that operates by receiving power from the battery pack 1000 including the plurality of battery cells 110, 120, 130, and 140, and the target device may be, for example, an electric vehicle (EV), but is not limited thereto.

The plurality of battery cells 110, 120, 130, and 140 may be a lithium ion (Li-ion) battery, an Li-ion polymer battery, a nickel-cadmium (Ni—Cd) battery, a nickel hydrogen (Ni—

MH) battery, etc., and may are not limited thereto. Meanwhile, although one battery module 100 is illustrated in FIG. 1, the battery module 100 may be configured in plural according to an embodiment.

The battery management apparatus 200 may manage and/or control a state and/or an operation of the battery module 100. For example, the battery management apparatus 200 may manage and/or control the states and/or operations of the plurality of battery cells 110, 120, 130, and 140 included in the battery module 100. The battery management apparatus 200 may manage charging and/or discharging of the battery module 100.

In addition, the battery management apparatus 200 may monitor a voltage, a current, a temperature, etc., of the battery module 100 and/or each of the plurality of battery cells 110, 120, 130, and 140 included in the battery module 100. A sensor or various measurement modules for monitoring performed by the battery management apparatus 200, may be additionally installed in the battery module 100, a charging/discharging path, any position of the battery module 100, etc. The battery management apparatus 200 may calculate a parameter indicating a state of the battery module 100, e.g., a state of charge (SOC), a state of health (SOH) etc., based on a measurement value such as monitored voltage, current, temperature, etc.

The battery management apparatus 200 may control an operation of the relay 300. For example, the battery management apparatus 200 may short-circuit the relay 300 to supply power to the target device. The battery management apparatus 200 may short-circuit the relay 300 when a charging device is connected to the battery pack 1000.

The battery management apparatus 200 may calculate a cell balancing time of each of the plurality of battery cells 110, 120, 130, and 140. Herein, the cell balancing time may be defined as a time required for balancing of the battery cell. For example, the battery management apparatus 200 may calculate a cell balancing time based on an SOC, a battery capacity, and a balancing efficiency of each of the plurality of battery cells 110, 120, 130, and 140.

The battery management apparatus 200 may include a power supply management apparatus 210.

The power supply management apparatus 210 may prevent a power supply switch (i.e., the relay 300) for maintaining or cutting off power supply to an electric device connected to the battery pack 1000 from being opened earlier than a minimum power supply maintaining time, through a duplexing operation, thereby guaranteeing power supply to the electric device.

A battery management system (BMS), which is the battery management apparatus 200, may detect a fault of the battery pack 1000 and send fault detection information to another module, as a battery control system that identifies charging/discharging, a remaining battery capacity, etc. Thus, even when a mechanical or chemical defect occurs in the battery management apparatus 200 or the battery module 100, the ultimate safety of vehicle control may be provided by continuously supplying power to the battery management apparatus 200.

Hereinbelow, a configuration and an operation of the power supply management apparatus 210 will be described in detail.

Figure 2:
FIG. 2 is a block diagram of a battery supply management apparatus according to an embodiment disclosed herein.
Figure 3:
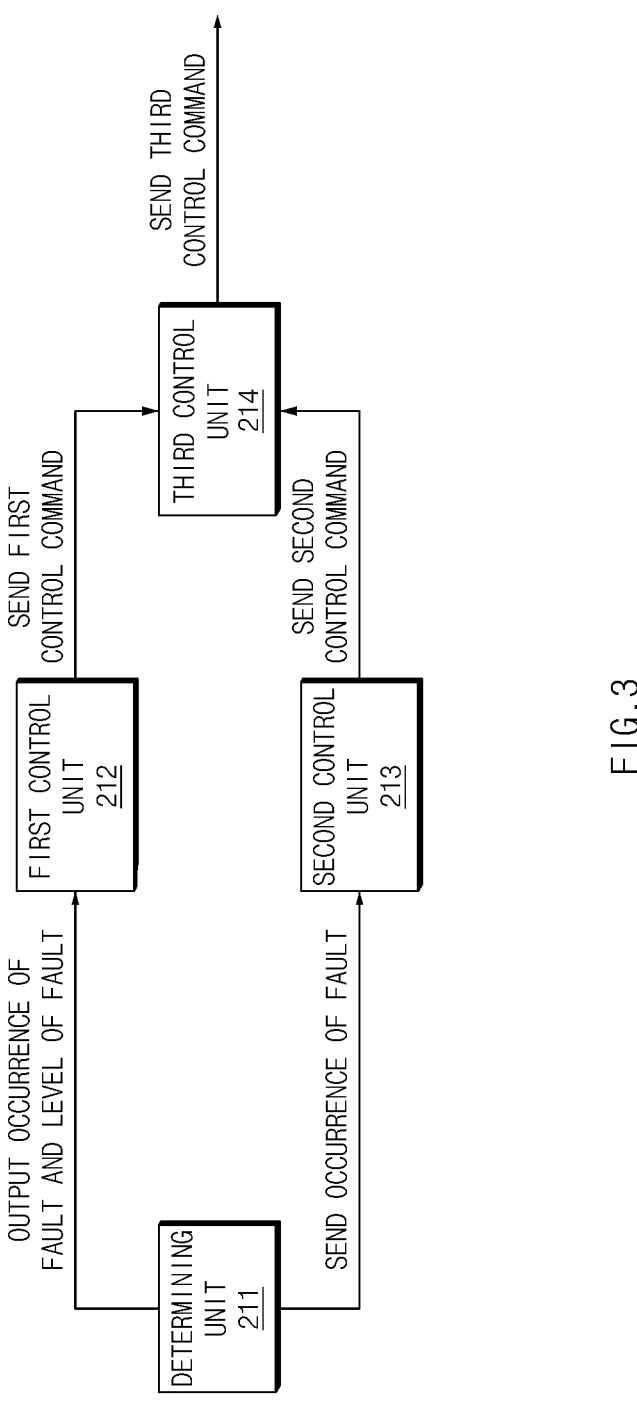
FIG. 3 is a view for describing an operation of a battery supply management apparatus, according to an embodiment disclosed herein.

FIG. 2 is a block diagram of a battery supply management apparatus according to an embodiment disclosed herein. FIG. 3 shows an operating system of a power supply management apparatus, according to an embodiment disclosed herein.

Referring to FIG. 2, the power supply management apparatus 210 according to an embodiment disclosed herein may include a determining unit 211, a first control unit 212, a second control unit 213, and a third control unit 214.

The determining unit 211 may perform a fault detection function that determines existence of a fault inside a system. Herein, the fault may be defined as a feature or a parameter of a component inside the system deviating from a prescribed condition by an allowable deviation or more. The determining unit 211 may determine a level of a fault when the fault occurs. For example, the determining unit 211 may determine whether the fault occurs in the battery management apparatus 200, and determine the level of the occurring fault.

For example, the level of the fault may be defined as a level determined according to an automotive safety integrity level (ASIL) risk level. For example, the ASIL level may be a criterion for determining a vehicle safety integrity level and may be determined according to severity, exposure, and controllability of damage caused by malfunction of vehicle parts through vehicle-level risk source analysis and risk assessment.

Herein, the ASIL level may be classified into four categories ASIL A, ASIL B, ASIL C, and ASIL D. The ASIL level may define ASIL D as the highest risk criterion and ASIL A as the lowest risk criterion.

For example, when overvoltage or undervoltage occurs in a battery cell due to occurrence of a short-circuit in a battery module control cable of the BMS or a battery module diagnosis cable, such that a temperature of a battery rises and thus the risk of battery ignition is expected, then the level of the fault of the BMS may be determined as the ASIL D level.

The first control unit 212 may set a control point in time for cutting off power supply to a load according to a level of a fault and generate a first control command according to the control point in time.

That is, the first control unit 212 may set a control point in time for cutting off power supply to a load according to an ASIL level of the fault, received from the determining unit 211, and generate the first control command according to the control point in time.

For example, when a fault occurs in an electric device, a case may occur where power supply has to be guaranteed up to a certain time, according to a level of the fault based on the ASIL level.

For example, a case where voltage measurement is impossible because a wiring harness terminal of the BMS is not fixed during driving of the vehicle, causing overcharging of a battery cell, has a higher level of a risk caused by a fault than that of a case where the risk of battery ignition is caused and that of a case where a temporary communication error occurs in a network control device (an electronic control unit (ECU)) of the BMS, such that power supply may be maintained for a certain time without immediately cutting off the power supply.

Therefore, the first control unit 212 may set a control point in time for cutting off power supply to a load according to a level of a fault to further supply power for a certain time without immediately cutting off the power supply.

For example, the first control unit 212 may generate the first control command by using a fault monitoring module and a controller.

For example, the fault monitoring module may monitor fault detection information including a level of a fault and set a control point in time for cutting off power supply to a load according to the level of the fault. That is, the first control unit 212 may set the control point in time for cutting off power supply according to an ASIL level of the fault, received from the determining unit 211, by using the fault monitoring module. The controller may generate the first control command according to the control point in time received from the fault monitoring module.

Herein, the first control command may have a first value before the control point in time and have a second value from the control point in time. For example, the first value may be a digital signal of 0, and the second value may be a digital signal of 1.

For example, the first control command may be a digital signal of 0 as a signal for not opening a power supply switch before the control point in time, and may be a digital signal of 1 as a signal for opening a power supply switch from the control point in time.

The second control unit 213 may generate a second control command corresponding to a power supply maintaining time when a fault occurs. That is, when a fault occurs in an electric device, the second control unit 213 may set a minimum power supply maintaining time for maintaining power supply and generate a second control command that is a power supply command corresponding to the minimum power supply maintaining time.

For example, the second control unit 213 may generate the second control command by using a function inhibition manager (FIM) and a controller. Herein, the FIM may inhibit a function of a particular module under a specific condition. For example, when the fault is detected, the FIM may set a power supply maintaining time for inhibiting opening of a switch for power supply to the electric device. The controller may generate the second control command corresponding to the power supply maintaining time.

That is, even when an unexpected operation error or a fault occurs in the fault monitoring module or the controller of the first control unit 212, the second control unit 213 may maintain the power supply by inhibiting opening of the switch for the power supply to the electric device during the power supply maintaining time through the FIM.

For example, the second control command may be a first value during the power supply maintaining time and be a second value after the power supply maintaining time. For example, the first value may be a digital signal of 0, and the second value may be a digital signal of 1.

Thus, the second control unit 213 may inhibit opening of the switch for the power supply for a specific time, separately from the first control command of the second control unit 213, by generating the second control command for controlling the power supply, thereby securing the minimum power supply maintaining time.

The third control unit 214 may generate a third control command for controlling power supply to a load, based on the first control command and the second control command.

Referring to FIG. 3, the third control unit 214 may receive the first control command sent from the first control unit 212 and the second control command sent from the second control unit 213, thereby generating the third control command. That is, the third control unit 214 may be understood as a duplexing operation device based on the first control command and the second control command.

The third control unit 214 may perform power supply management based on a duplexing operation, thereby guaranteeing power supply to the electric device even when a fault occurs in any one of the first control unit 212 and the second control unit 213.

That is, the third control unit 214 may prevent the switch for the power supply to the electric device from being opened earlier than the power supply maintaining time corresponding to the level of the fault or the minimum power supply maintaining time corresponding to occurrence of the fault, through such a duplexing operation.

The third control unit 214 may generate the third control command for controlling the power supply to the load, by using one logic device that performs the duplexing operation.

For example, the third control unit 214 may include an OR logic gate or an AND logic gate. Herein, the third control unit 214 may generate the third control command for maintaining the power supply to the load when at least any one of the first control command and the second control command has the first value.

Figure 4:
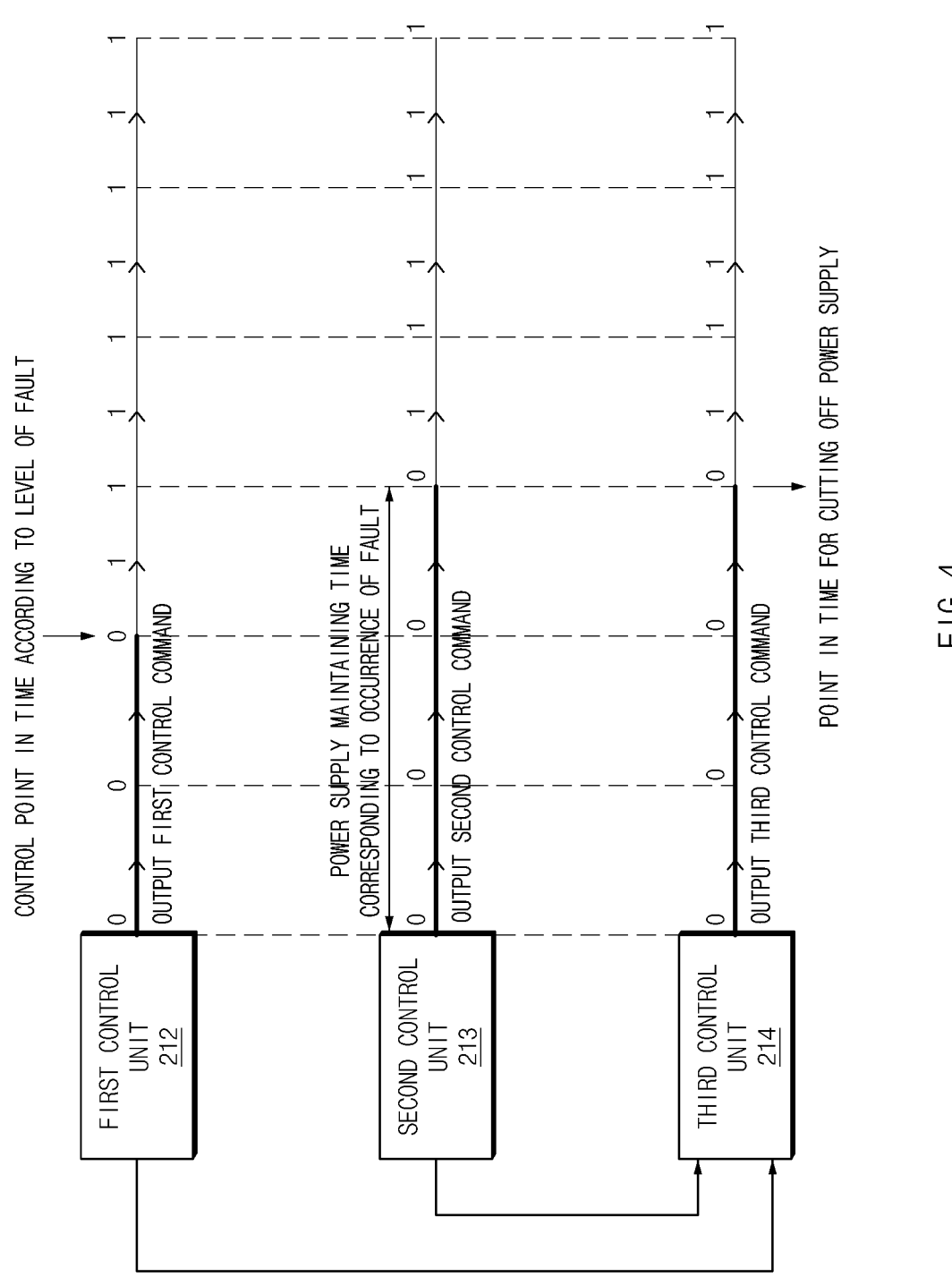
FIG. 4 shows a process in which a third control unit of a power supply management apparatus according to an embodiment disclosed herein generates a third control command by using an AND logic gate.
Figure 5:
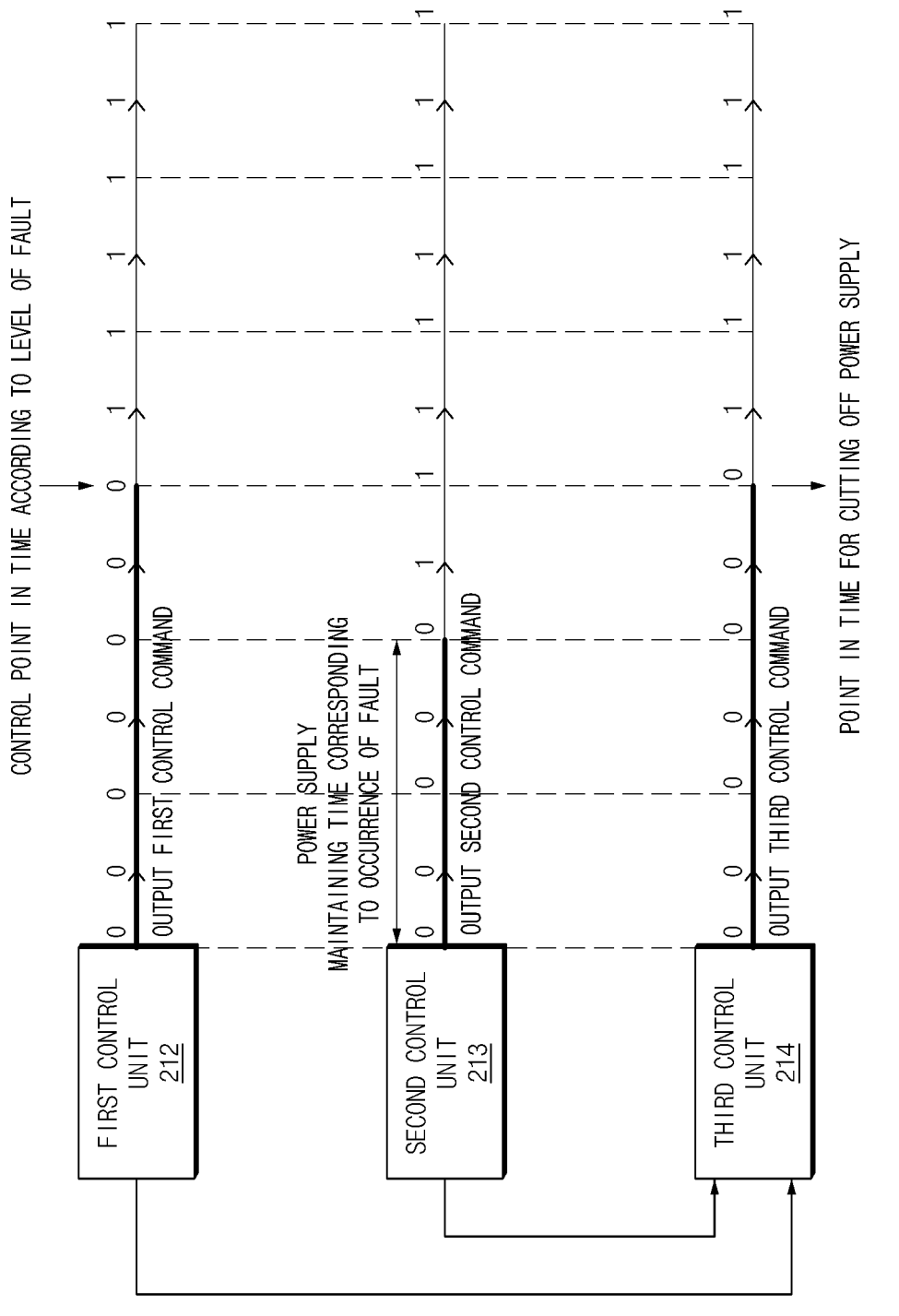
FIG. 5 shows a process in which a third control unit of a power supply management apparatus according to another embodiment disclosed herein generates a third control command by using an AND logic gate.

FIGS. 4 and 5 show a process where the third control unit 214 of the power supply management apparatus 210 generates the third control command by using the AND logic gate. Herein, the digital signal of 0 may be a power supply signal, for example, a signal for prohibiting opening of a switch for power supply, and the digital signal of 1 may be a power supply cutoff signal, for example, a signal for opening the switch for the power supply.

Referring to FIGS. 4 and 5, the third control unit 214 may output the third control command having the digital signal of 1 from a point in time when values of both the first control command and the second control command output the digital signal of 1, according to an operating principle of the AND logic gate.

More specifically, referring to FIG. 4, the power supply maintaining time of the second control unit 213 may expire after the control point in time of the first control unit 212. Thus, the AND logic gate of the third control unit 214 may receive the digital signal of 1 from both the first control unit 212 and the second control unit 213 and output the digital signal of 1 through an AND operation, after the power supply maintaining time of the second control unit 213. That is, the third control unit 214 may generate the third control command that is a power supply cutoff signal, after the power supply maintaining time of the second control unit 213.

Referring to FIG. 5, the control point in time of the first control unit 212 may arrive after the power supply maintaining time of the second control unit 213. Thus, the AND logic gate of the third control unit 214 may receive the digital signal of 1 from both the first control unit 212 and the second control unit 213 and output the digital signal of 1 through the AND operation, from the control point in time of the first control unit 212. That is, the third control unit 214 may generate the third control command that is a power supply cutoff signal, from the control point in time of the first control unit 212.

Thus, the third control unit 214, when using the AND logic gate, may generate the third control command for maintaining the power supply to the load when at least any one of the first control command and the second control command has the digital signal of 0, which is the power supply signal, as the first value.

Figure 6:
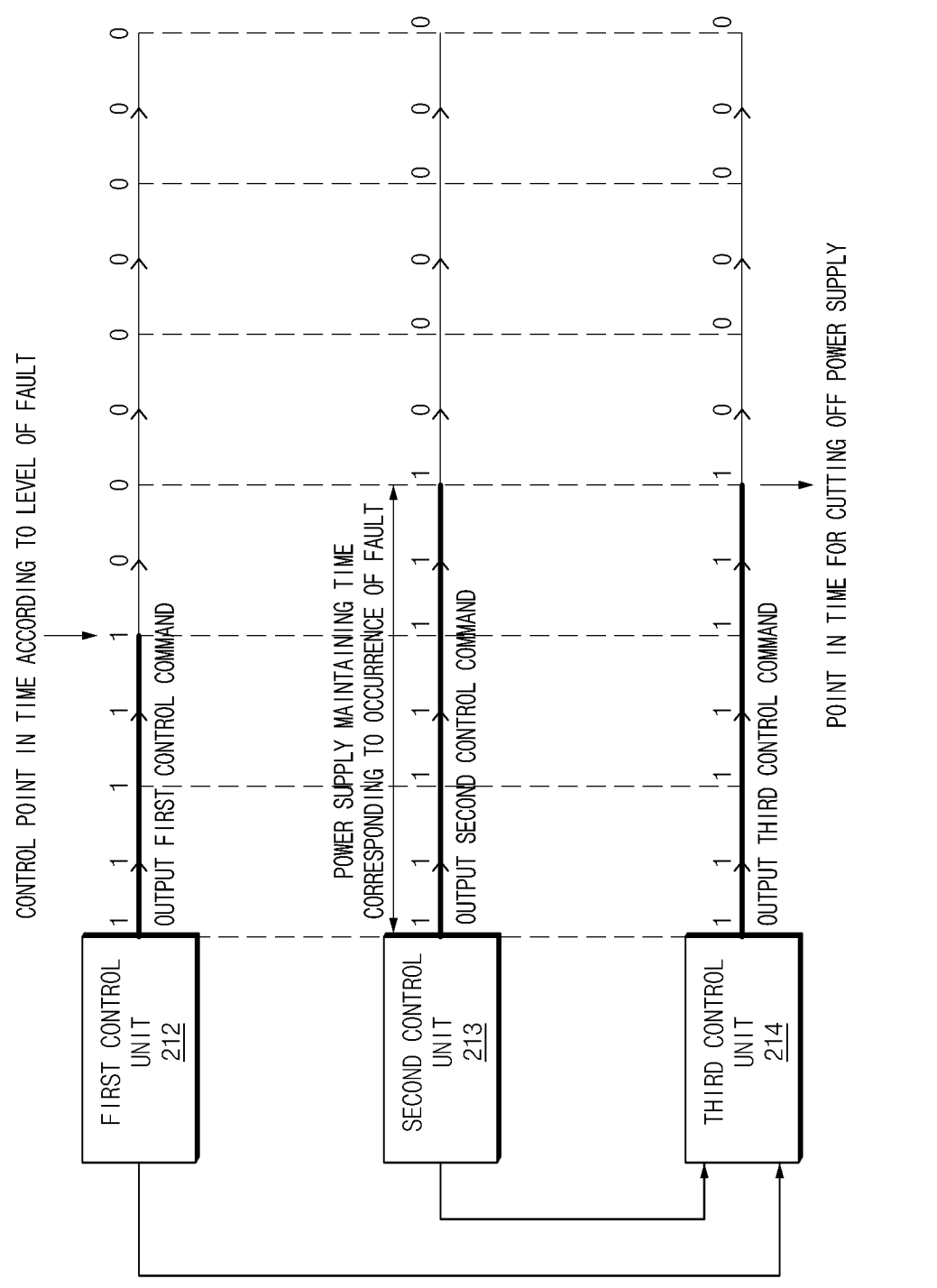
FIG. 6 shows a process in which a third control unit of a power supply management apparatus according to an embodiment disclosed herein generates a third control command by using an OR logic gate.
Figure 7:
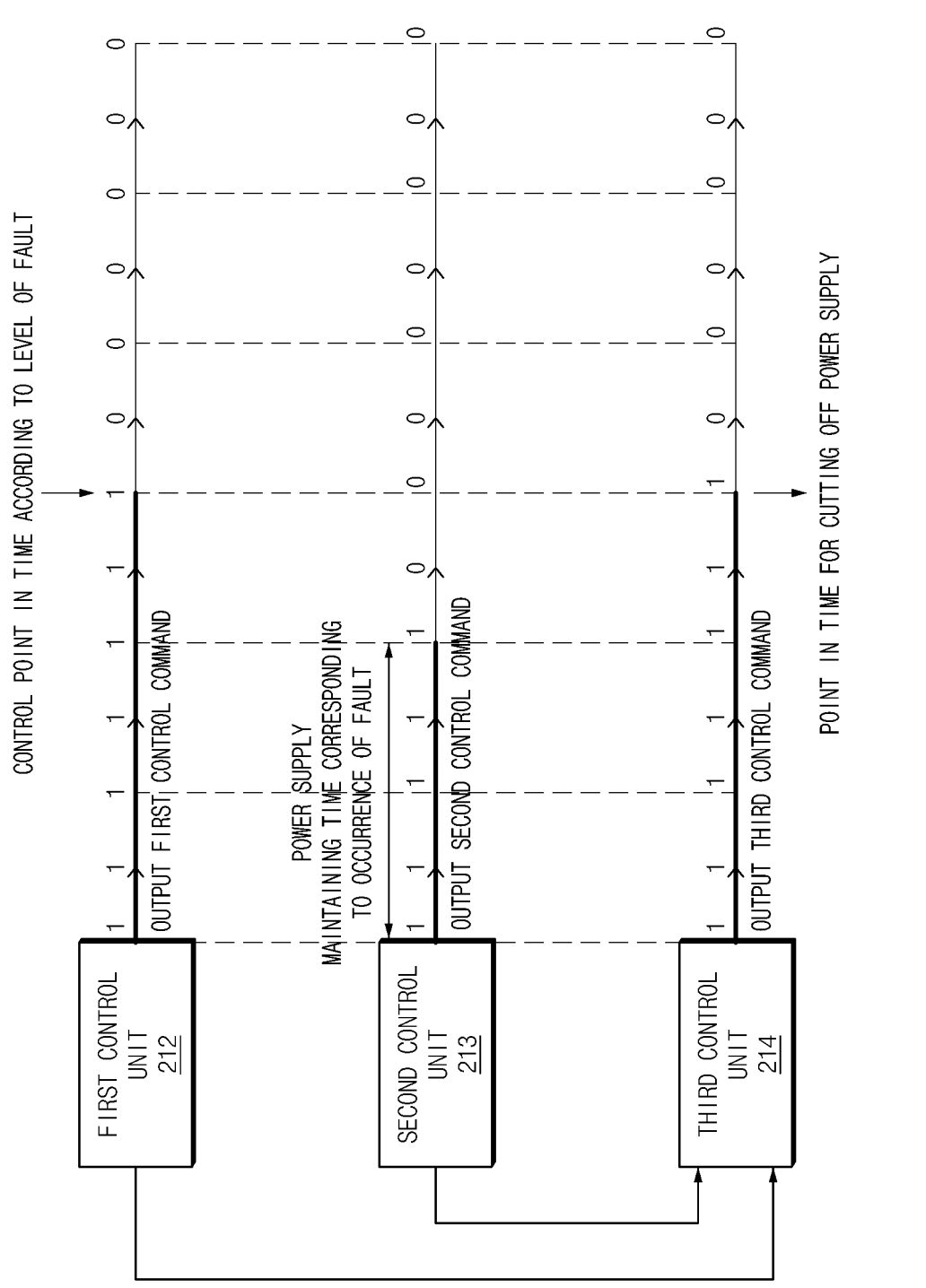
FIG. 7 shows a process in which a third control unit of a power supply management apparatus according to another embodiment disclosed herein generates a third control command by using an OR logic gate.

FIGS. 6 and 7 show a process where the third control unit 214 of the power supply management apparatus 210 generates the third control command by using the OR logic gate. Herein, the digital signal of 1 may be a power supply signal, for example, a signal for prohibiting opening of a switch for power supply, and the digital signal of 0 may be a power supply cutoff signal, for example, a signal for opening the switch for the power supply.

The third control unit 214 may output the digital signal of 0 as the third control command from a point in time when the values of both the first control command and the second control command output the digital signal of 0, according to an operating principle of the OR logic gate.

First, referring to FIG. 6, the power supply maintaining time of the second control unit 213 may expire after the control point in time of the first control unit 212. Thus, the third control unit 214 may receive the digital signal of 0 from both the first control unit 212 and the second control unit 213 and output the digital signal of 0 through an OR operation, after the power supply maintaining time of the second control unit 213. That is, the third control unit 214 may generate the third control command that is the power supply cutoff signal, after the power supply maintaining time of the second control unit 213.

Referring to FIG. 7, the control point in time of the first control unit 212 may arrive after the power supply maintaining time of the second control unit 213. Thus, the third control unit 214 may receive the digital signal of 0 from both the first control unit 212 and the second control unit 213 and output the digital signal of 0 through the OR operation, from the control point in time of the first control unit 212. That is, the third control unit 214 may generate the third control command that is the power supply cutoff signal, from the control point in time of the first control unit 212.

Thus, the third control unit 214, when using the OR logic gate, may generate the third control command for maintaining the power supply to the load when at least any one of the first control command and the second control command has the digital signal of 1, which is the power supply signal, as the first value.

As a result of referring to FIGS. 3 through 6, the third control unit 214 may generate the third control command for maintaining the power supply by using the AND logic gate or the OR logic gate, when at least any one of the first control command and the second control command outputs the power supply signal. Thus, the power supply management apparatus 210, even when generating a signal for cutting off power supply due to occurrence of an error in any one of the first control command and the second control command, may maintain the power supply to the electric signal based on a power supply signal of the other.

As described above, the power supply management apparatus 210 according to an embodiment disclosed herein may maintain power supply up to a certain point in time according to a level of a fault when the fault occurs in the electric device such as a BMS.

Figure 8:
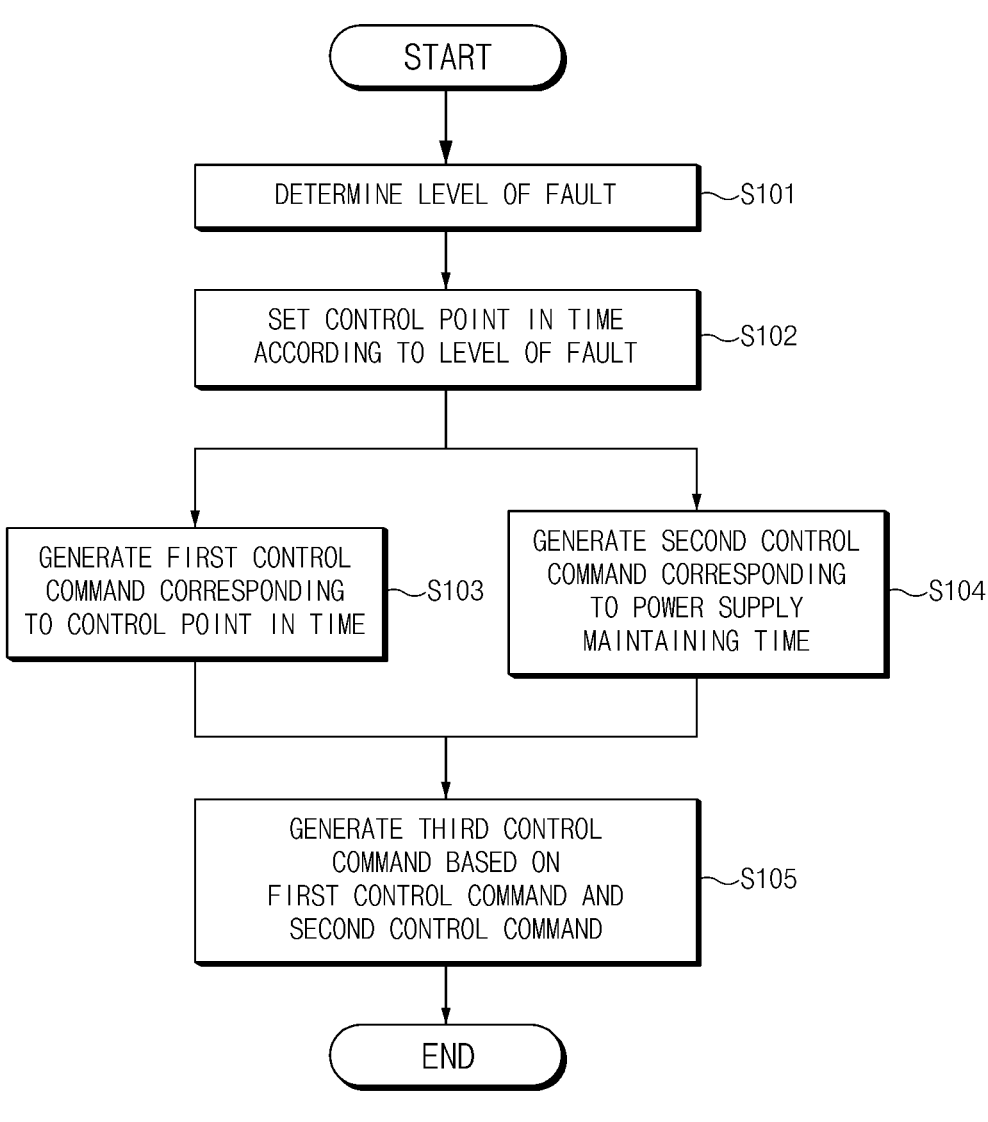
FIG. 8 is a flowchart showing an operating method of a power supply management apparatus according to an embodiment disclosed herein.

FIG. 8 is a flowchart showing an operating method of a power supply management apparatus according to an embodiment disclosed herein.

Referring to FIG. 8, an operating method of a power supply management apparatus according to an embodiment disclosed herein may include operation S101 of determining a level of a fault when the fault occurs, operation S102 of setting a control point in time for cutting off power supply to a load according to the level of the fault, operation S103 of generating a first control command according to the control point in time, operation S104 of generating a second control command corresponding to a power supply maintaining time when the fault occurs, and operation S105 of generating a third control command for controlling the power supply to the load based on the first control command and the second control command.

Hereinbelow, operations S101 through S105 will be described in detail with reference to FIG. 2.

In operation S101, the determining unit 211 may determine a level of a fault when the fault occurs.

For example, the level of the fault may be defined as a level determined according to an ASIL risk level.

In operation S102, the determining unit 211 may set a control point in time for cutting off power supply to a load, according to the level of the fault.

In operation S103, the first control unit 212 may generate a first control command according to the control point in time.

In operation S103, the first control unit 212 may set the control point in time for cutting off the power supply to the load according to the level of the fault to further supply power for a certain time without immediately cutting off the power supply.

For example, in operation S103, the first control unit 212 may generate the first control command by using a fault monitoring module and a controller.

For example, in operation S103, the fault monitoring module may monitor fault detection information including the level of the fault and set the control point in time for cutting off the power supply to the load according to the level of the fault. That is, in operation S103, the first control unit 212 may set the control point in time for cutting off power supply according to the ASIL level of the fault, received from the determining unit 211, by using the fault monitoring module. The controller may generate the first control command according to the control point in time received from the fault monitoring module.

For example, in operation S103, the first control command may have a first value before the control point in time and have a second value from the control point in time. For example, the first value may be the digital signal of 0, and the second value may be the digital signal of 1.

In operation S103, for example, the first control command may have the first value before the control point in time and have the second value from the control point in time. For example, the first value may be the digital signal of 0, and the second value may be the digital signal of 1.

In operation S104, the second control unit 213 may generate a second control command corresponding to a power supply maintaining time when the fault occurs.

In operation S104, for example, the second control unit 213 may generate the second control command by using an FIM and a controller. Herein, the FIM may inhibit a function of a particular module under a specific condition. For example, when the fault is detected in the electric device, the FIM may set a power supply maintaining time for inhibiting opening of a switch for power supply to the electric device. The controller may generate the second control command corresponding to the power supply maintaining time.

In operation S104, for example, the second control command may be the first value during the power supply maintaining time and be the second value after the power supply maintaining time. For example, the first value may be the digital signal of 0, and the second value may be the digital signal of 1.

In operation S105, the third control unit 214 may generate a third control command for controlling the power supply to the load, based on the first control command and the second control command.

In operation S105, the third control unit 214 may generate the third control command by using the OR logic gate or the AND logic gate.

In operation S105, the third control unit 214 may generate the third control command for controlling the power supply to the load, by using one logic device that performs the duplexing operation.

For example, in operation S105, the third control unit 214 may include the OR logic gate or the AND logic gate. Herein, the third control unit 214 may generate the third control command for maintaining the power supply to the load when at least any one of the first control command and the second control command has the first value.

The above description is merely illustrative of the technical idea of the present invention, and various modifications and variations will be possible without departing from the essential characteristics of the present invention by those of ordinary skill in the art to which the present invention pertains.

Therefore, the embodiments disclosed in the present invention are intended for description rather than limitation of the technical spirit of the present invention and the scope of the technical spirit of the present invention is not limited by these embodiments. The protection scope of the present invention should be interpreted by the following claims, and all technical spirits within the same range should be understood to be included in the range of the present invention.

The invention claimed is:

1. A power supply management apparatus comprising:
a determining unit configured to determine a level of a fault in a battery module when the fault occurs;
a first control unit configured to set a control point in time for cutting off power supply to a load according to the level of the fault and generate a first control command according to the control point in time;
a second control unit configured to generate a second control command corresponding to a power supply maintaining time when the fault occurs; and
a third control unit configured to generate a third control command for controlling the power supply to the load, based on the first control command and the second control command,
wherein the determining unit is configured to output an occurrence of the fault and the level of the fault to the first control unit, and is configured to output the occurrence of the fault to the second control unit,
wherein the second control unit is configured to generate the second control command when the determining unit outputs the occurrence of the fault to the second control unit, and
wherein the power supply management apparatus is configured to control a charging and/or a discharging of the battery module based on at least one of the first control command, the second control command and the third control command.

2. The power supply management apparatus of claim 1, wherein the first control command has a first value before the control point in time and has a second value from the control point in time.

3. The power supply management apparatus of claim 2, wherein the second control command has the first value during the power supply maintaining time and has the second value after the power supply maintaining time.

4. The power supply management apparatus of claim 3, wherein the third control unit is further configured to generate the third control command for maintaining the power supply to the load when at least any one of the first control command and the second control command has the first value.

5. The power supply management apparatus of claim 1, wherein the third control unit comprises an OR logic gate or an AND logic gate.

6. The power supply management apparatus of claim 1, wherein the second control unit is further configured to generate the second control command by using a function inhibition manager (FIM).

7. The power supply management apparatus of claim 1, wherein the determining unit does not directly transmit the occurrence of the fault or the level of the fault to the third control unit.

8. The power supply management apparatus of claim 1, wherein a duration of time to the control point in time for cutting off power supply to the load is less than a duration of time of the power supply maintaining time.

9. The power supply management apparatus of claim 1, wherein a duration of time to the control point in time for cutting off power supply to the load is greater than a duration of time of the power supply maintaining time.

10. The power supply management apparatus of claim 1, wherein the determining unit does not output the level of the fault to the second control unit.

11. The power supply management apparatus of claim 1, wherein the power supply management apparatus is configured to control a relay connected to the battery module.

12. The power supply management apparatus of claim 11, wherein the first control command is a command including having the relay in a closed state before the control point in time and having the relay in an open state after the control point in time.

13. The power supply management apparatus of claim 12, wherein the second control command includes preventing the open state of the relay for a specific time.

14. The power supply management apparatus of claim 13, wherein the third control command includes preventing the relay from being in the open state earlier than the power supply maintaining time.

15. An operating method of a power supply management apparatus, the operating method comprising:

determining a level of a fault in a battery module when the fault occurs;

setting a control point in time for cutting off power supply to a load according to the level of the fault;

outputting, by a determining unit, an occurrence of the fault and the level of the fault to a first control unit, and the occurrence of the fault to a second control unit;

generating, by the first control unit, a first control command according to the control point in time;

generating, by the second control unit, a second control command corresponding to a power supply maintaining time when the fault occurs;

generating a third control command for controlling the power supply to the load, based on the first control command and the second control command; and controlling a charging and/or a discharging of the battery module based on at least one of the first control command, the second control command and the third control command.

16. The operating method of claim 15, wherein the first control command has a first value before the control point in time and has a second value from the control point in time.

17. The operating method of claim 16, wherein the second control command has the first value during the power supply maintaining time and has the second value after the power supply maintaining time.

18. The operating method of claim 17, wherein the generating of the third control command for controlling the power supply to the load, based on the first control command and the second control command is performed when at least any one of the first control command and the second control command has the first value.

19. The operating method of claim 15, wherein the generating of the third control command for controlling the power supply to the load, based on the first control command and the second control command includes using an OR logic gate or an AND logic gate.

20. The operating method of claim 15, wherein the generating of the second control command corresponding to the power supply maintaining time when the fault occurs is performed using a function inhibition manager (FIM).

* * * * *